(12) United States Patent
Kanechika et al.

(10) Patent No.: US 9,449,965 B2
(45) Date of Patent: Sep. 20, 2016

(54) SEMICONDUCTOR DEVICE AND METHOD OF MANUFACTURING THE SAME

(71) Applicants: KABUSHIKI KAISHA TOYOTA CHUO KENKYUSHO, Nagakute-shi, Aichi-ken (JP); TOYOTA JIDOSHA KABUSHIKI KAISHA, Toyota-shi, Aichi-ken (JP)

(72) Inventors: Masakazu Kanechika, Nagakute (JP); Hiroyuki Ueda, Nagakute (JP); Hidemoto Tomita, Toyota (JP)

(73) Assignees: KABUSHIKI KAISHA TOYOTA CHUO KENKYUSHO, Nagakute (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/806,749

(22) Filed: Jul. 23, 2015

(65) Prior Publication Data

US 2016/0035719 A1   Feb. 4, 2016

(30) Foreign Application Priority Data

Jul. 29, 2014   (JP) ................................ 2014-153463

(51) Int. Cl.
*H01L 27/06*   (2006.01)
*H01L 21/8232*   (2006.01)
(Continued)

(52) U.S. Cl.
CPC ....... *H01L 27/0629* (2013.01); *H01L 21/8232* (2013.01); *H01L 29/205* (2013.01);
(Continued)

(58) Field of Classification Search
CPC ........... H01L 29/0847; H01L 29/0891; H01L 29/205; H01L 29/66431; H01L 29/66462; H01L 29/778; H01L 29/7783; H01L 29/7786

USPC ........................... 257/77, 186, 192, 276, 325
See application file for complete search history.

(56) References Cited

U.S. PATENT DOCUMENTS

2008/0121934 A1   5/2008 Matsuda
2010/0019279 A1   1/2010 Chen et al.
(Continued)

FOREIGN PATENT DOCUMENTS

JP   2011-205029 A   10/2011
JP   2012-175018 A   9/2012
(Continued)

OTHER PUBLICATIONS

Jan. 5, 2016 Office Action issued in Singapore Patent Application No. 10201505824Y.
(Continued)

*Primary Examiner* — Dung Le
(74) *Attorney, Agent, or Firm* — Oliff PLC

(57) ABSTRACT

Both a HEMT and a SBD are formed on a nitride semiconductor substrate. The nitride semiconductor substrate comprises a HEMT gate structure region and an anode electrode region. A first laminated structure is formed at least in the HEMT gate structure region, and includes first to third nitride semiconductor layers. A second laminated structure is formed at least in a part of the anode electrode region, and includes first and second nitride semiconductor layers. The anode electrode contacts the front surface of the second nitride semiconductor layer. At least in a contact region in which the front surface of the second nitride semiconductor layer contacts the anode electrode, the front surface of the second nitride semiconductor layer is finished to be a surface by which the second nitride semiconductor layer forms a Schottky junction with the anode electrode.

11 Claims, 4 Drawing Sheets

(51) Int. Cl.
  *H01L 29/205*  (2006.01)
  *H01L 29/66*   (2006.01)
  *H01L 29/778*  (2006.01)
  *H01L 29/872*  (2006.01)
  *H01L 29/20*   (2006.01)
  *H01L 29/06*   (2006.01)
  *H01L 29/08*   (2006.01)
  *H01L 29/10*   (2006.01)

(52) U.S. Cl.
  CPC ..... H01L29/66462 (2013.01); H01L 29/7786 (2013.01); H01L 29/872 (2013.01); *H01L 29/0619* (2013.01); *H01L 29/0895* (2013.01); *H01L 29/1066* (2013.01); *H01L 29/2003* (2013.01)

(56) References Cited

U.S. PATENT DOCUMENTS

| | | |
|---|---|---|
| 2011/0233615 A1 | 9/2011 | Machida |
| 2012/0217544 A1 | 8/2012 | Ohki |
| 2013/0082276 A1 | 4/2013 | Park et al. |
| 2013/0248931 A1 | 9/2013 | Saito et al. |
| 2014/0049296 A1 | 2/2014 | Jeon et al. |
| 2014/0141580 A1* | 5/2014 | Kub ............... H01L 29/0847 438/172 |
| 2014/0306235 A1* | 10/2014 | Decoutere ......... H01L 27/0605 257/76 |

FOREIGN PATENT DOCUMENTS

| | | |
|---|---|---|
| JP | 2013-232578 A | 11/2013 |
| KR | 2013-0035477 A | 4/2013 |

OTHER PUBLICATIONS

Uemoto, Yasuhiro et al., "GaN Monolithic Inverter IC Using Normally-off Gate Injection Transistors with Planar Isolation on Si Substrate", IEDM 09-165-168, 2009, IEEE.

Jul. 19, 2016 Office Action issued in Korean Application No. 10-2015-0104203.

* cited by examiner

SEMICONDUCTOR DEVICE AND METHOD OF MANUFACTURING THE SAME

CROSS-REFERENCE TO RELATED APPLICATION

This application claims priority to Japanese Patent Application No. 2014-153463 filed on Jul. 29, 2014, the contents of which are hereby incorporated by reference into the present application.

TECHNICAL FIELD

Disclosed herein is a technique that forms a normally-off field effect transistor and a Schottky barrier diode on a common nitride semiconductor substrate.

DESCRIPTION OF RELATED ART

Patent Literature 1 (Japanese Patent Application Publication No. 2011-205029) discloses a technique of forming a Schottky Barrier Diode (to be referred to as an SBD (Schottky Barrier Diode) hereinafter) and a field effect transistor (to be referred to as a HEMT (High Electron Mobility Transistor) hereinafter) that uses a potential of a gate electrode for controlling a two-dimensional electron gas generated along a heterojunction interface on a common nitride semiconductor substrate.

The HEMT easily exhibits normally-on characteristics due to a reason that a threshold voltage serves as a negative potential. Non-patent literature 1 ("*GaN Monolithic inverter IC Using Normally-off Gate Injection Transistors with Planar Isolation on Si Substrate*" Yasuhiro Uemoto et. al, IEDM 09-165-168, 2009, IEEE) discloses a technique that interposes a p-type nitride semiconductor layer between a heterojunction interface and a gate electrode to achieve normally-off characteristics, which is easier to control.

In Patent Literature 1, the HEMT is protected by the SBD. Although Patent Literature 1 discloses the technique of forming the HEMT and the SBD on a common nitride semiconductor substrate, the technique does not make the HEMT normally-off by using a p-type layer.

Although Non-patent Literature 1 discloses a HEMT which is made normally-off by using a p-type layer, an SBD is not used together with the HEMT therein. Non-patent Literature 1 discloses using a circuit in which the HEMT does not need to be protected by the diode.

This specification discloses a technique that forms a HEMT which is made normally-off by using a p-type layer and an SBD on a common nitride semiconductor substrate.

BRIEF SUMMARY OF INVENTION

A nitride semiconductor cannot be easily converted into a p-type semiconductor by injecting acceptor impurities therein. Therefore, when a HEMT which is made normally-off by using a p-type layer is to be manufactured, a laminated substrate in which the p-type layer has already been crystal-grown in a stage of crystal growth is used. For this purpose, in the course of manufacturing the normally-off HEMT and the SBD, when the SBD and the HEMT which is made normally-off by using the p-type layer are formed on the common nitride semiconductor substrate, a laminated substrate including a p-type layer is prepared, and then etching and removal of the p-type nitride semiconductor layer are performed in a region except for a region in which a gate structure of the HEMT is formed. More specifically, in a region where the SBD is formed, the SBD is manufactured from a state in which the p-type nitride semiconductor layer has been etched and the nitride semiconductor layer forming a heterojunction interface has been exposed.

In the following description, the p-type nitride semiconductor layer which is etched and removed in the region except for the region in which the gate structure is formed is called a "nitride semiconductor-removed layer", and a nitride semiconductor layer exposed after the nitride semiconductor-removed layer is removed is called a "nitride semiconductor-remaining layer". In a HEMT region, the nitride semiconductor-remaining layer serves as an electron supply layer.

In a case where the nitride semiconductor-removed layer is removed in the region where the SBD is formed whereby the nitride semiconductor-remaining layer is exposed, an SBD should be obtained if an anode electrode which forms a Schottky junction with the nitride semiconductor-remaining layer and a cathode electrode which forms an ohmic junction with the nitride semiconductor-remaining layer are formed on the nitride semiconductor-remaining layer. However, even though the above operations are actually performed, the SBD which exhibits preferable rectification characteristics cannot be obtained.

As disclosed in Patent Literature 1, it is possible to form the HEMT and the SBD on a common nitride semiconductor substrate. However, if a technique of making the HEMT normally-off by using a p-type layer is implemented, the SBD which exhibits preferable rectification characteristics cannot be obtained. Although Non-patent Literature 1 discloses a technique of making the HEMT normally-off by using a p-type layer, a circuit which does not require a diode is used so as to cope with the problem that the SBD which exhibits preferable rectification characteristics cannot be obtained when the laminated substrate in which the p-type layer has been crystal-grown is used.

The present specification discloses a technique of forming both a HEMT which is made normally-off by using a p-type layer and an SBD on a common nitride semiconductor substrate.

Studies were conducted on a reason why, even though an anode electrode and a cathode electrode are formed on a front surface of a nitride semiconductor-remaining layer exposed by etching a p-type nitride semiconductor-removed layer, an SBD which exhibits preferable rectification characteristics cannot be obtained.

As a result of the studies, it was found that, when the nitride semiconductor-remaining layer was exposed by etching the nitride semiconductor-removed layer, etching damage was given to the exposed surface of the nitride semiconductor-remaining layer, and the etching damage prevented a Schottky junction from being formed between the anode electrode and the nitride semiconductor-remaining layer. As a result of the finding, it was further found that, if a technique of preventing the etching damage from being given, a technique of preventing the etching damage from adversely affecting the exposed surface, and/or a technique of repairing the etching damage are implemented, it becomes possible to obtain the SBD which exhibits preferable rectification characteristics by forming an anode electrode and a cathode electrode on the front surface of the nitride semiconductor-remaining layer that had been exposed by etching the nitride semiconductor-removed layer.

As a result of the findings, a novel semiconductor device in which both a normally-off HEMT and an SBD are formed on a common nitride semiconductor substrate has been developed. The semiconductor device may include the following configurations.

The nitride semiconductor substrate may comprise: a HEMT gate structure region where a gate structure of the HEMT is formed; and an anode electrode region where an anode electrode of the SBD is formed. The nitride semiconductor substrate further may comprise: a laminated structure formed at least in the HEMT gate structure region, and including a first nitride semiconductor layer; a second nitride semiconductor layer crystal-grown on a front surface of the first nitride semiconductor layer, and a third nitride semiconductor layer crystal-grown on a front surface of the second nitride semiconductor layer.

The nitride semiconductor substrate may further comprise a laminated structure formed at least in a part of the anode electrode region, and including the first nitride semiconductor layer and the second nitride semiconductor layer. More specifically, the third nitride semiconductor layer may not exist in at least in the part of the anode electrode region. The anode electrode of the SBD may contact a front surface of the second nitride semiconductor layer.

In the above description, a bandgap of the second nitride semiconductor may be larger than a bandgap of the first nitride semiconductor, and the third nitride semiconductor may be p-type. At least in a contact region in which the front surface of the second nitride semiconductor layer contacts the anode electrode, the front surface of the second nitride semiconductor layer may be finished to be a surface by which the second nitride semiconductor layer forms the Schottky junction with the anode electrode.

When the font surface of the second nitride semiconductor layer is finished to be the front surface which forms the Schottky junction with the anode electrode, the SBD which exhibits preferable rectification characteristics can be obtained. The semiconductor device in which the HEMT which is made normally-off by using a p-type layer and the SBD which exhibits preferable rectification characteristics am formed on the common nitride semiconductor substrate can be obtained.

For example, when an AlO film is exposed on the front surface of the second nitride semiconductor layer, at least in the contact region in which the front surface of the second nitride semiconductor layer contacts the anode electrode, the front surface of the second nitride semiconductor layer may be finished to be the front surface which forms the Schottky junction with the anode electrode.

Alternatively, also by forming the second nitride semiconductor layer including a deep layer and a surface layer and creating a relation that a bandgap of the surface layer is larger than a bandgap of the deep layer, the front surface of the second nitride semiconductor layer may be finished to be the front surface which forms the Schottky junction with the anode electrode.

After exposing the second nitride semiconductor layer by etching the third nitride semiconductor layer, by conducting a heat treatment, in a gas including nitrogen, to the semiconductor substrate, the front surface of the second nitride semiconductor layer may also be finished to be the front surface which forms the Schottky junction with the anode electrode.

Alternatively, the third nitride semiconductor layer may be etched to expose the second nitride semiconductor layer by employing an etching method which hardly gives etching damage to the second nitride semiconductor layer. In this case as well, the front surface of the second nitride semiconductor layer may be finished to be the front surface which forms the Schottky junction with the anode electrode.

If the third nitride semiconductor layer is not removed in the mode electrode region where the anode electrode is formed, the front surface of the second nitride semiconductor layer may be finished to be the front surface which forms the Schottky junction with the anode electrode. For example, by preventing the third nitride semiconductor layer from being crystal-grown in the region where the anode electrode is to be formed in the course of crystal-growing the third nitride semiconductor layer, the front surface of the second nitride semiconductor layer may be finished to be the front surface which forms the Schottky junction with the anode electrode.

The third nitride semiconductor layer may be removed in an entire area of the region where the anode electrode is formed. Alternatively, in a part of the region where the anode electrode is formed, the third nitride semiconductor layer may be laminated on the front surface of the second nitride semiconductor layer. When the front surface of the second nitride semiconductor layer, which exists in the contact region in which the third nitride semiconductor layer is not present and the anode electrode and the second nitride semiconductor layer are in direct contact with each other, is finished to be the front surface which forms the Schottky junction with the anode electrode, an SBD which exhibits preferable rectification characteristics can be obtained. The third nitride semiconductor layer which may be present in the part of the anode electrode region where the anode electrode is formed improves breakdown voltage characteristics of the SBD.

The present specification also discloses a method for manufacturing the semiconductor device that includes a HEMT and an SBD formed on a common nitride semiconductor substrate. The method for manufacturing may comprise: preparing a laminated substrate of nitride semiconductor that includes a second nitride semiconductor layer crystal-grown on a front surface of a first nitride semiconductor layer, and a third nitride semiconductor layer crystal-grown on a front surface of the second nitride semiconductor layer, exposing the second nitride semiconductor layer by removing the third nitride semiconductor layer at least in a region in which an anode electrode of the SBD is to be formed; and forming the anode electrode of the HEMT on the exposed surface of the second nitride semiconductor layer exposed in the removing. This method for manufacturing may further comprise finishing an exposed surface of the second nitride semiconductor layer exposed in the removing such that the exposed surface of the second nitride semiconductor layer forms a Schottky junction with the anode electrode.

In a case where the above finishing is included, manufacturing of the SBD which exhibits preferable rectification characteristics becomes possible.

Various methods may be used in the finishing as follows.
(1) For example, a nitride semiconductor including Al may be used as the second nitride semiconductor layer. In this case, when the third nitride semiconductor layer is etched to expose the second nitride semiconductor layer, a gas which oxidizes the exposed surface of the second nitride semiconductor layer may be used. In this case, the exposed surface of the second nitride semiconductor layer can be finished to be the front surface which forms the Schottky junction with the anode electrode.
(2) Alternatively, the second nitride semiconductor layer may be configured by a surface layer having a larger bandgap and a deep layer having a smaller bandgap. The third nitride semiconductor layer may be etched to expose the surface layer. In this case, the exposed surface of the second nitride semiconductor layer can be finished to be the front surface which forms the Schottky junction with the anode electrode.

(3) Alternatively, a heat treatment in a gas containing nitrogen may be conducted on the nitride semiconductor substrate having the second nitride semiconductor layer exposed by the removing. In this case, the exposed surface can be recovered to be the front surface which forms the Schottky junction with the anode electrode.

Alternatively, in at least a part of the region where the anode electrode of the SBD is to be formed, the third nitride semiconductor layer may be wet-etched in the removing of the third nitride semiconductor layer to expose the second nitride semiconductor layer. When the third nitride semiconductor layer is wet-etched, the exposed surface of the second nitride semiconductor layer may be less damaged. Thereby, a front surface which forms a Schottky junction can be obtained when the anode electrode is formed on the exposed surface. Further, the finishing may be included in the exposing. This mans that the exposing by the wet-etching serves the purpose of the finishing as well as the exposing.

According to the specification, the HEMT which is made normally-off by using a p-type layer and the SBD which exhibits preferable rectification characteristics can be formed on the common nitride semiconductor substrate.

DETAILED DESCRIPTION OF INVENTION

Figure 1:
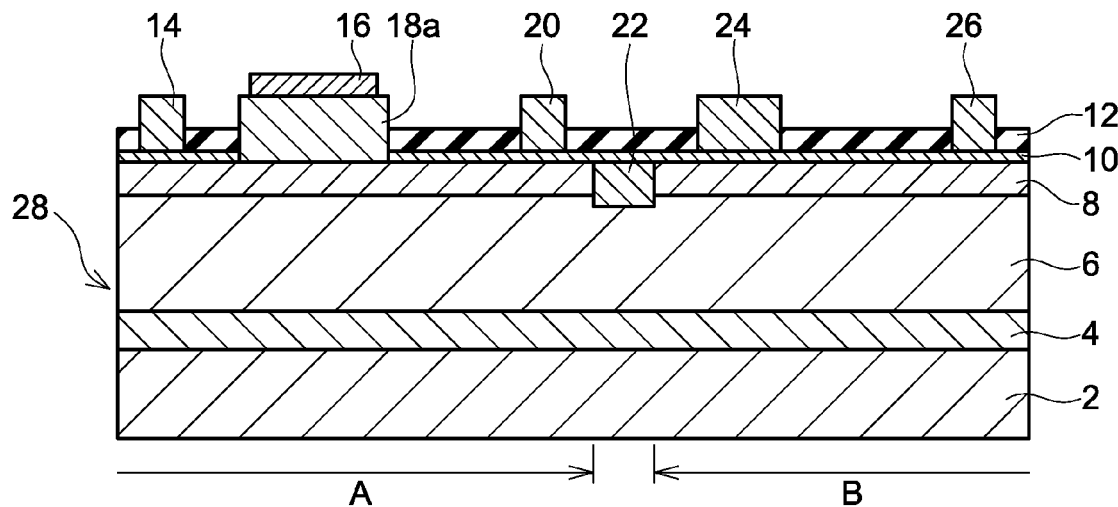
FIG. 1 is a sectional view of a semiconductor device according to a first embodiment.

Features of a technique to be disclosed in the specification will be listed. The items which will be described later have independent technical usabilities, respectively. All the items, solely or in combination, are encompassed in the technical scope of this application.

(First feature) A thickness of an AlO film exposed on a front surface of a second nitride semiconductor layer is adjusted to a thickness which achieves a Schottky junction between an anode electrode and the second nitride semiconductor layer and achieves an ohmic junction between a cathode electrode and the second nitride semiconductor layer.

(Second feature) All of a first nitride semiconductor layer serving as an electron transport layer, a deep layer of a second nitride semiconductor serving as an electron supply layer, a surface layer of the second nitride semiconductor (which may serve as a nitride semiconductor-remaining layer in relation to a manufacturing method) which is to form a Schottky junction between the anode electrode and the second nitride semiconductor, and a third nitride semiconductor layer (which may serve as a nitride semiconductor-removed layer in relation to a manufacturing method) which makes a HEMT normally-off are made of a nitride semiconductor.

(Third feature) A magnitude relationship of bandgaps satisfies a relationship: first nitride semiconductor layer<deep layer of second nitride semiconductor<surface layer of second nitride semiconductor.

(Fourth feature) A thickness of the surface layer of the second nitride semiconductor is several nanometers, by which a Schottky junction is formed between the anode electrode and the deep layer of the second nitride semiconductor, and an ohmic junction is formed between the cathode electrode and the second nitride semiconductor layer.

(Fifth feature) A nitride semiconductor containing Al is used as the nitride semiconductor-remaining layer. The nitride semiconductor-removed layer is etched by using an etching gas containing oxygen when the nitride semiconductor-removed layer is etched (during at least a period prior to the end of etching). According to this technique, the nitride semiconductor-removed layer is etched and removed, and the front surface of the nitride semiconductor-remaining layer exposed by the etching is oxidized, and the AlO film is exposed an the front surface of the nitride semiconductor-remaining layer. When the AlO film is exposed on the front surface of the nitride semiconductor-remaining layer, adverse effect by the etching damage is canceled, and an anode electrode which forms a Schottky junction with the nitride semiconductor-remaining layer can be formed by forming a metal film on the surface of the AlO film. That is, when a metal having a work function which can be calculated as being capable of forming a Schottky junction is formed on the front surface of the nitride semiconductor-remaining layer, a result that the Schottky junction is formed between the metal film and the nitride semiconductor-remaining layer can be obtained as calculated.

(Sixth feature) In place of the etching for the nitride semiconductor-removed layer by using the etching gas containing oxygen, the nitride semiconductor-removed layer may be etched by using an etching gas not containing oxygen, and the front surface of the nitride semiconductor-remaining layer exposed as a result of the etching may be exposed to oxygen plasma. By exposing the front surface of the nitride semiconductor-remaining layer to the oxygen plasma, a state in which an AlO film is exposed on the front surface of the nitride semiconductor-remaining layer can be obtained.

(Seventh feature) In place of the method of exposing the AlO film on the front surface of the nitride semiconductor-remaining layer, a nitride semiconductor-remaining layer may be formed by a deep layer of $Al_xGa_{1-x}N$ and a surface layer of $Al_zGa_wIn_{1-z-w}N$, and an anode electrode may be formed on a front surface of the surface layer. In place of the $Al_zGa_wIn_{1-z-w}N$, a layer of an oxide of the $Al_zGa_wIn_{1-z-w}N$ may be used. In the above description, $0<x<1$ and $0<1-z-w<1$ are satisfied.

(Eighth feature) In order to obtain the structure of the seventh feature, in a stage of epitaxial growth, a substrate in which an $Al_1Ga_{1-x}N$ layer serving as a deep layer of the nitride semiconductor-remaining layer is formed, an $Al_z$-$Ga_wIn_{1-z-w}N$ layer serving as a surface layer of the nitride semiconductor-remaining layer is laminated thereon, and a p-type nitride semiconductor layer serving as the nitride semiconductor-removed layer is laminated thereon may be formed. In a gate structure region where a gate structure of a HEMT is formed, the p-type nitride semiconductor layer is maintained. As a result, in the region where the gate structure of the HEMT is formed, the surface layer of $Al_zGa_wIn_{1-z-w}N$ also remains. In an anode electrode region where an anode electrode an SBD is formed, the p-type nitride semiconductor layer is removed and the surface layer of $Al_zGa_wIn_{1-z-w}N$ is maintained. According to the manufacturing method, a structure in which the nitride semiconductor-remaining layer is formed by the deep layer of $Al_xGa_{1-x}N$ and the surface layer of $Al_zGa_wIn_{1-z-w}N$ (or an oxide thereof), and the anode electrode is formed on the front surface of the $Al_zGa_wIn_{1-z-w}N$ (or an oxide thereof) can be obtained.

In general, when a nitride semiconductor-remaining layer is formed by a deep layer having a smaller bandgap and a surface layer having a larger bandgap, the front surface of the surface layer exposed by etching a nitride semiconductor-removed layer may be finished to be a front surface which forms a Schottky junction with an anode electrode.

(Ninth feature) An etching method which gives less damage to the nitride semiconductor-remaining layer may be employed when the nitride semiconductor-remaining layer is exposed by etching the nitride semiconductor-removed layer. For example, when the nitride semiconductor-removed layer is wet-etched by using a condition which etches the nitride semiconductor-removed layer and does not etch the nitride semiconductor-remaining layer, the nitride semiconductor-removed layer can be etched while hardly giving any etching damage to the nitride semiconductor-remaining layer. When the nitride semiconductor-remaining layer has been exposed in this manner, a metal film which forms a Schottky junction can be formed on the front surface of the nitride semiconductor-remaining layer. For example, Japanese Patent Application Publication No. 2012-60066, contents of which are incorporated herein by reference, discloses a wet etching method using electrochemical processes, which can be used.

(Tenth feature) In place of the employment of the etching method which gives less etching damage, repairing etching damage may be added as an alternative thereof. In many etching damages given to the nitride semiconductor-remaining layer, nitrogen atoms drop out of the nitride semiconductor-remaining layer. When the front surface of the nitride semiconductor-remaining layer on which nitrogen defects have occurred is thermally treated while being exposed to an ammonia gas or the like containing nitrogen, the nitrogen defects are repaired. Thereafter, an anode electrode is formed and a Schottky junction is formed.

(Eleventh feature) A nitride semiconductor substrate in which a third nitride semiconductor layer of p-type is crystal-grown in the gate structure region and the third nitride semiconductor layer of p-type is not crystal-grown in the anode electrode region is used. Since etching does not need to be performed in the anode electrode region, the front surface of the second nitride semiconductor layer can be maintained to be a front surface which forms a Schottky junction with the anode electrode.

Some of the technical features disclosed in the present specification may be summarized as described below. A normally-off HEMT and an SBD are formed on a common nitride semiconductor substrate.

The common nitride semiconductor substrate has a laminated structure including a first nitride semiconductor laycer a second nitride semiconductor layer (corresponding to the nitride semiconductor-remaining layer) crystal-grown on a front surface of the first nitride semiconductor layer, and a third nitride semiconductor layer (corresponding to the nitride semiconductor-removed layer) crystal-grown an a front surface of the second nitride semiconductor layer.

The bandgap of the second nitride semiconductor layer is larger than that of the first nitride semiconductor layer.

The third nitride semiconductor layer is p-type.

The third nitride semiconductor layer is not present in a region except for a region in which a gate structure of the HEMT is formed. However, more specifically, the third nitride semiconductor layer may be present in a part of a region where the anode electrode of the SBD is formed.

The anode electrode of the SBD is formed on the front surface of the second nitride semiconductor layer.

The front surface of the second nitride semiconductor layer has been finished to be a front surface which forms a Schottky junction between the second nitride semiconductor layer and the anode electrode.

According to the conventional techniques, etching damage was given to the front surface of the second nitride semiconductor layer to roughen the front surface. Due to this, even though an anode electrode was formed on the roughened front surface, a Schottky junction was not formed between the second nitride semiconductor layer and the anode electrode. In techniques of the present specification, in order to solve the problem, a front surface which forms a Schottky junction between the second nitride semiconductor layer and the anode electrode when the anode electrode is formed on the front surface, is formed prior to actual formation of the anode electrode.

DETAILED DESCRIPTION OF EMBODIMENTS (First Embodiment)
As shown in FIG. 1, in a semiconductor device according to a first embodiment, a HEMT and an SBD are formed on one same nitride semiconductor substrate 28. The HEMT is formed in a region A, and the SBD is formed in a region B.

The nitride semiconductor substrate 28 according to the embodiment includes a laminated structure configured by a substrate 2, a buffer layer 4 crystal-grown on a front surface of the substrate 2, a first nitride semiconductor layer 6 crystal-grown on a front surface of the buffer layer 4, a second nitride semiconductor layer 8 crystal-grown on a front surface of the first nitride semiconductor layer 6, and a third nitride semiconductor layer 18 crystal-grown on a front surface of the second nitride semiconductor layer 8.

FIG. 1 shows a state after the third nitride semiconductor layer 18 is etched and removed in a region except for a region in which a gate electrode 16 (which will be described later) is formed, and shows only a remaining region 18a.

The first nitride semiconductor layer 6 is a layer serving as an electron transport layer of the HEMT, and is made of a nitride semiconductor crystal. The second nitride semiconductor layer 8 is a layer serving as an electron supply layer of the HEMT, and is made of a nitride semiconductor crystal. A bandgap of the first nitride semiconductor layer 6 is smaller than a bandgap of the second nitride semiconductor layer 8, and a two-dimensional electron gas is present in an area along a heterojunction interface of the first nitride semiconductor layer 6. The third nitride semiconductor layer 18 is made of a p-type nitride semiconductor crystal, and controls the HEMT such that the HEMT has normally-off characteristics (which will be described later).

An object of the nitride semiconductor substrate 28 is to provide a heterojunction between the first nitride semiconductor layer 6 and the second nitride semiconductor layer 8. The buffer layer 4 may be a layer serving as a base by which the first nitride semiconductor layer 6 can be crystal-grown on the front surface of the buffer layer 4, and may not necessarily be a nitride semiconductor. The substrate 2 maybe a layer serving as a base by which the buffer layer 4 can be crystal-grown on the front surface of the substrate 2, and may not necessarily be a nitride semiconductor. If a nitride semiconductor is used as the substrate 2, the buffer layer 4 may be omitted. When the buffer layer 4 is used, a Si substrate, a SiC substrate, or a sapphire substrate other than a nitride semiconductor substrate may be used as the substrate 2.

The third nitride semiconductor layer 18 may be a p-type layer which forms a depletion layer on the heterojunction interface, and may not necessarily be a nitride semiconductor. However, since the layer 18 is to be crystal-grown on the front surface of the second nitride semiconductor layer 8, the use of a crystal layer of a nitride semiconductor is practical.

As is apparent from the above description, the nitride semiconductor substrate mentioned in the specification is a substrate which provides the first nitride semiconductor layer 6, the second nitride semiconductor layer 8, and the p-type third nitride semiconductor layer 18.

In the present embodiment, a Si substrate is used as the substrate 2, AlGaN is used as the buffer layer 4, i-type GaN is used as the first nitride semiconductor layer 6, i-type $Al_xGa_{1-x}N$ is used as the second nitride semiconductor layer 8, and p-type $Al_yGa_{1-y}N$ is used as the third nitride semiconductor layer 18. A bandgap of GaN is smaller than a bandgap of $Al_xGa_{1-x}N$, where $0<x$ and $y\leq 1$ are satisfied.

As shown in FIG. 1, in an entire region except for a region in which the gate electrode 16 (which will be described later) is formed, the third nitride semiconductor layer 18 is removed by etching, and the front surface of the second nitride semiconductor layer 8 is exposed. Notably, the second nitride semiconductor layer 8 contains Al, and the surface of the second nitride semiconductor layer 8 is oxidized. For this reason, an AlO film 10 is exposed on the front surface of the second nitride semiconductor layer 8.

In the HEMT forming region A, on the front surface of the second nitride semiconductor layer 8 on which the AlO film 10 is exposed, a source electrode 14 and a drain electrode 20 are formed. The source electrode 14 and the drain electrode 20 are each made of a metal film which forms an ohmic junction with the front surface of the second nitride semiconductor layer 8. In an intermediate position between the source electrode 14 and the drain electrode 20, i.e., a position separating the source electrode 14 and the drain electrode 20 from each other, the part 18*a* of the p-type third nitride semiconductor layer remains, and the gate electrode 16 is formed on a front surface of the part 18*a*.

As described above, the bandgap of GaN configuring the first nitride semiconductor layer 6 is smaller than the bandgap of $Al_xGa_{1-x}N$ configuring the second nitride semiconductor layer 8, and a two-dimensional electron gas is formed in the area along the heterojunction interface of the first nitride semiconductor layer 6.

The part 18*a* of the p-type third nitride semiconductor layer remains at a position facing the heterojunction interface. A depletion layer extends from the p-type third nitride semiconductor layer 18*a* toward the second nitride semiconductor layer 8 and the first nitride semiconductor layer 6.

When no positive potential is applied to the gate electrode 16, the heterojunction interface in the region facing the gate electrode 16 is depleted through the p-type third nitride semiconductor layer 18*a*, and electrons cannot be moved between the source electrode 14 and the drain electrode 20. An off state is set between the source electrode 14 and the drain electrode 20. When a positive potential is applied to the gate electrode 16, the depletion layer is eliminated whereby the source electrode 14 and the drain electrode 20 are connected to each other with the two-dimensional electron gas. An on state is set between the source electrode 14 and the drain electrode 20. According to the above description, it is understood that a normally-off HEMT can be obtained in the region A. The first nitride semiconductor layer 6 in which electrons move is of i-type, and contains small amount of impurity which blocks electrons from moving. The HEMT therefore has a low on-resistance.

In the SBD forming region B, an anode electrode 24 and a cathode electrode 26 are formed on the front surface of the second nitride semiconductor layer 8 of which surface is covered with the AlO film 10. The cathode electrode 26 is made of a metal film which forms an ohmic junction with the front surface of the second nitride semiconductor layer 8. In contrast to this, the anode electrode 24 is made of a metal film which forms a Schottky junction with the front surface of the second nitride semiconductor layer 8. In this manner, an SBD having preferable rectification characteristics can be obtained. A forward current flows in the area along the heterojunction interface of the first nitride semiconductor layer 6. A forward voltage drop is small.

In the above description, the source electrode 14 of the HEMT is in contact with the second nitride semiconductor layer 8 through the AlO film 10. Since the AlO film 10 has a high resistance, risk of increasing the on resistance of the HEMT might arise due to the presence of the AlO film 10 therebetween. However, when the AlO film 10 is reduced in thickness, the increase in on resistance can be suppressed to a negligible level. Even though the thickness of the AlO film 10 is reduced so as not to increase the on resistance, a Schottky junction is formed between the anode electrode 24 and the second nitride semiconductor layer 8. The same as described above is also applied to the drain electrode 20, and the AlO film 10 can be reduced so as not to cause the increase of the resistance between the drain electrode 20 and the second nitride semiconductor layer 8. The same as described above can also be applied to the cathode electrode 26, and the thickness of the AlO film 10 can be reduced not to increase the resistance between the cathode electrode 26 and the second nitride semiconductor layer 8. Even when the thickness of the AlO film 10 is made small enough to avoid the increase in the resistances, a Schottky junction can be formed between the anode electrode 24 and the second nitride semiconductor layer 8 by the AlO film 10.

It should be noted herein that before the formation of the source electrode 14, the drain electrode 20, and the cathode electrode 26, the AlO film 10 may be removed in advance by etching the regions in which the source electrode 14, the drain electrode 20, and the cathode electrode 26 are to be formed. The AlO film disposed in a predetermined region can be removed by wet processing using fluorinated acid and/or dry processing using chlorine gas.

If the front surface of the second nitride semiconductor layer 8 is not covered with the AlO film 10, even if the anode electrode 24 is formed by using a material capable of forming a Schottky junction with the second nitride semiconductor layer 8, the Schottky junction which exhibits preferable rectification characteristics cannot be obtained.

When the third nitride semiconductor layer 18 is etched to expose the front surface of the second nitride semiconductor layer 8, etching damage is given to the font surface of the second nitride semiconductor layer 8. For this reason, the anode electrode 24 does not form the Schottky junction with the second nitride semiconductor layer 8. Contrary to this, when the AlO film 10 is exposed an the front surface of the second nitride semiconductor layer 8, no etching damage is given, and the anode electrode 24 forms the Schottky junction with the second nitride semiconductor layer 8.
(Second Embodiment)

The same reference numerals as in the first embodiment denote the same members in the second embodiment to omit the same explanations. Only different aspects between the first embodiment and the second embodiment will be described below.

Figure 2:
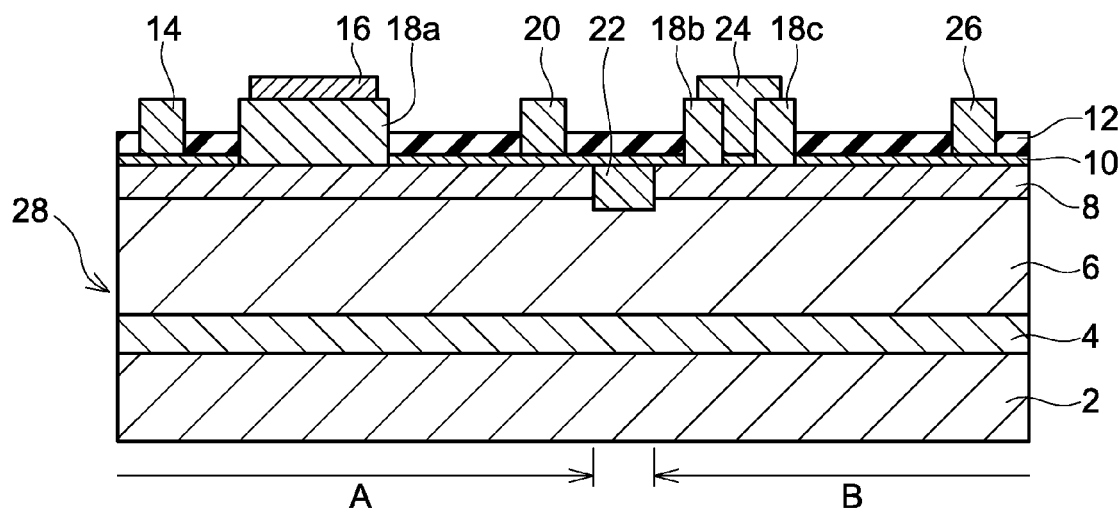
FIG. 2 is a sectional view of a semiconductor device according to a second embodiment.

As shown in FIG. 2, in a semiconductor device according to the second embodiment, a contact portion between the anode electrode 24 and the second nitride semiconductor layer 8 is different from that in the first embodiment. In the second embodiment, even at positions being in contact with the anode electrode 24, parts 18b and 18c of the p-type third nitride semiconductor layer 18 are caused to remain. More specifically, a structure in which the p-type third nitride semiconductor layers 18b and 18c are present on left and right sides of the contact portion between the anode electrode 24 and the second nitride semiconductor layer 8, is created.

According to the structure, when a reverse voltage is applied to the diode, a depletion layer extends from the p-type third nitride semiconductor layers 18b and 18c toward the contact portion between the anode electrode 24 and the second nitride semiconductor layer 8 and breakdown voltage resistivity is improved. A structure of a so-called JBC-type Schottky diode (Junction Barrier Controlled Schottky Diode) or a floating-junction-type Schottky diode can be achieved.
(Method of Manufacturing a Semiconductor Device According to the Second Embodiment)

Figure 3:
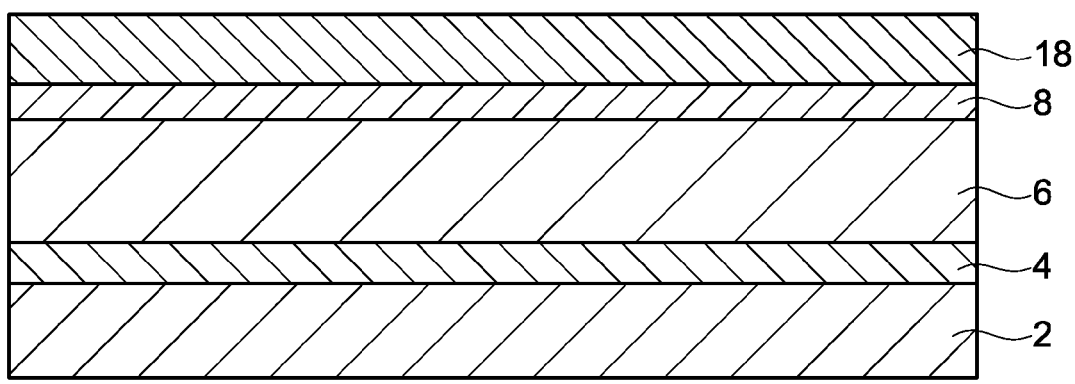
FIG. 3 shows a first stage of a method of manufacturing a semiconductor device according to the second embodiment.

A state in FIG. 3 is prepared as follows: A nitride semiconductor substrate is prepared. The nitride semiconductor substrate 2 includes a laminated structure in which a buffer layer 4 is epitaxially grown on a front surface of the substrate 2, a first nitride semiconductor layer 6 is epitaxially grown on a front surface of the buffer layer 4, a second nitride semiconductor layer 8 is epitaxially grown on a front surface of the first nitride semiconductor layer 6, and a third nitride semiconductor layer 18 is epitaxially grown on a front surface of the second nitride semiconductor layer 8. It is difficult to adjust a nitride semiconductor to be of a p-type by injecting an impurity into the nitride semiconductor. If the third nitride semiconductor layer 18 is formed during when the substrate is formed, a p-type crystal layer can be grown.

Figure 4:
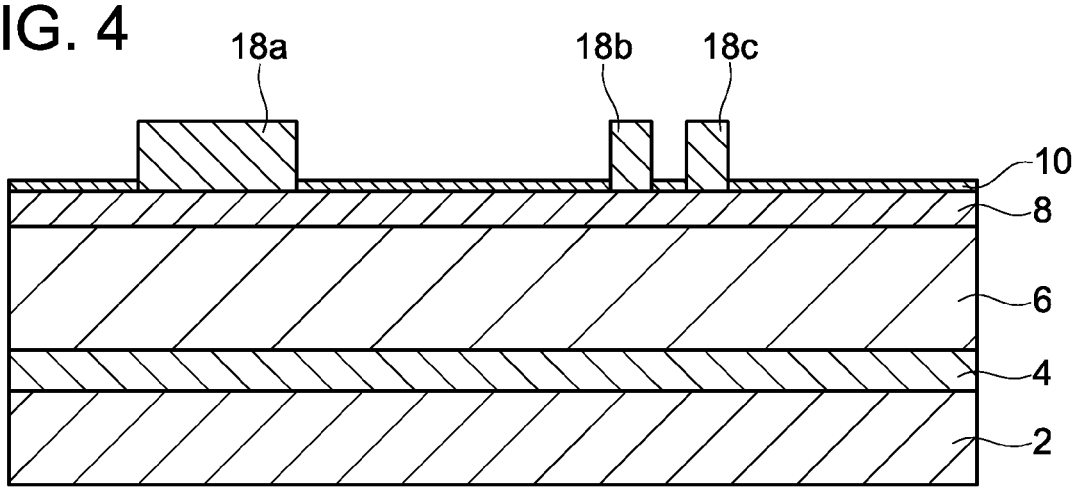
FIG. 4 shows a second stage of the method of manufacturing the semiconductor device according to the second embodiment.

A state in FIG. 4 is prepared as follows: A mask is formed on the front surface of the third nitride semiconductor layer 18, the mask having been patterned such that a third nitride semiconductor layer 18a remains in a portion where a gate electrode 16 is to be disposed and the third nitride semiconductor layers 18b and 18c remain in a portion where the anode electrode 24 is to be disposed. Then, the front surface of the third nitride semiconductor layer 18 is dry-etched and removed to expose the front surface of the second nitride semiconductor layer 8.

During the dry etching (at least a period immediately before the front surface of the second nitride semiconductor layer 8 is exposed), a gas containing oxygen is used for the dry etching. Due to this, the exposed surface of the second nitride semiconductor layer 8 is oxidized, and an AlO film 10 is formed on the exposed surface. Since i-type $Al_xGa_{1-x}N$ is used as the second nitride semiconductor layer 8, the AlO film 10 is formed due to oxidation of the Al. Thereafter, the mask is removed.

In place of the above operations, a gas not containing oxygen may be used for dry-etching the third nitride semiconductor layer 18 to expose the front surface of the second nitride semiconductor layer 8. In this case, after the dry-etching, oxygen plasma is irradiated on the front surface of the second nitride semiconductor layer 8. Also according to this, the state in which the AlO film 10 is exposed on the exposed front surface of the second nitride semiconductor layer 8 can be obtained.

Figure 5:
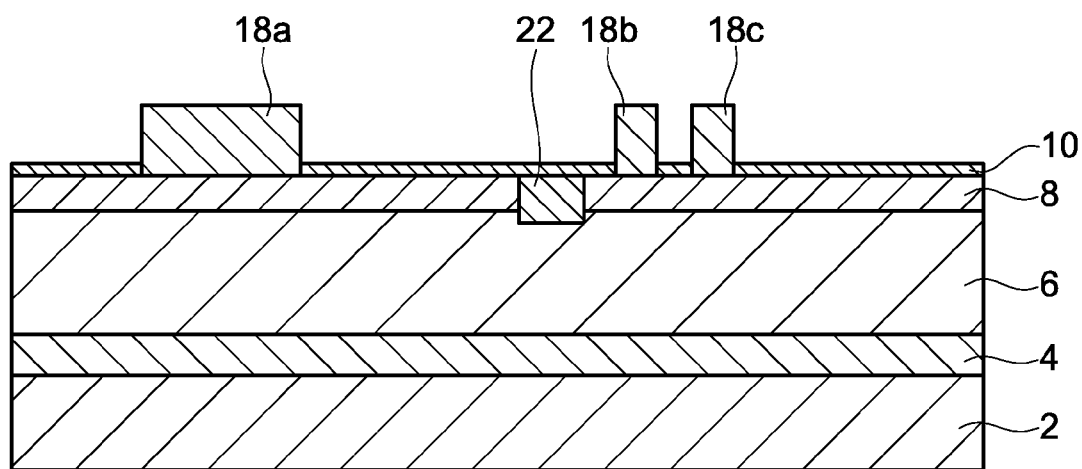
FIG. 5 shows a third stage of the method of manufacturing the semiconductor device according to the second embodiment.

A state in FIG. 5 is prepared as follows: An insulating region 22 for element isolation is formed. Herein, Fe, Zn, C, Al, Ar, N, B, P, or As is implanted into an area which is to serve as the insulating region 22. The insulating region 22 is formed to have a depth such that the insulating region 22 extends through the second nitride semiconductor layer 8 to reach the first nitride semiconductor layer 6. Due to this, the HEMT forming region A and the SBD forming region B are insulated and isolated from each other.

Figure 6:
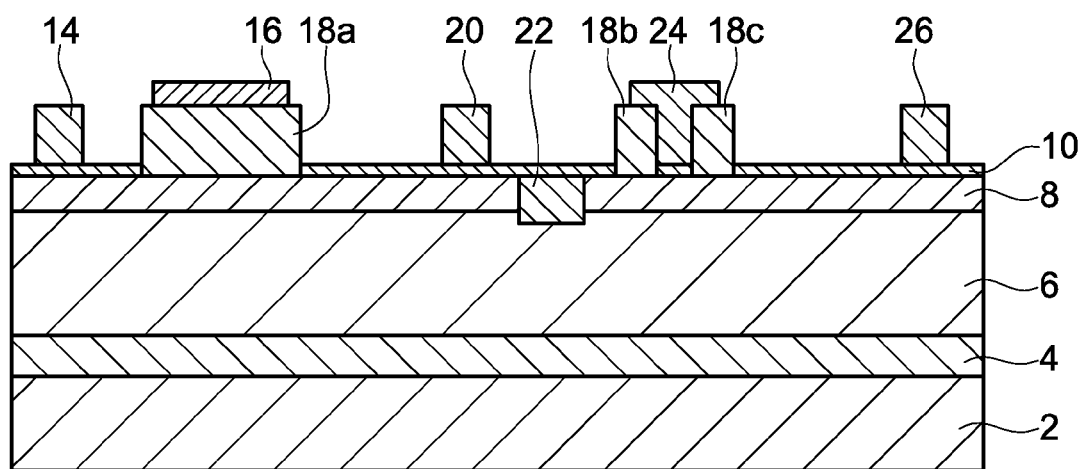
FIG. 6 shows a fourth stage of the method of manufacturing the semiconductor device according to the second embodiment.

A state in FIG. 6 is prepared as follows: On the surface of the second nitride semiconductor layer 8 on which the AlO film 10 is exposed, a source electrode 14, a drain electrode 20, an anode electrode 24, and a cathode electrode 26 are formed. The anode electrode 24 is in contact with not only the second nitride semiconductor layer 8 but also the p-type nitride semiconductor layers 18b and 18c.

Further, the gate electrode 16 is formed on a front surface of the p-type nitride semiconductor layer 18a.

Finally, a passivation film 12 is formed. As described above, the structure shown in FIG. 2 is manufactured.

Notably, the AlO film 10 which is present in the regions where the source electrode 14, the drain electrode 20, and the cathode electrode 26 are to be formed may be removed before the source electrode 14, the drain electrode 20, and the cathode electrode 26 are formed.
(Third Embodiment)

A semiconductor device according to a third embodiment will be described below with reference to FIG. 7. The semiconductor device according to the present embodiment, as shown in FIG. 8, is manufactured by using a substrate in which a surface layer 30 of a second nitride semiconductor (hereinafter referred to as 'second nitride semiconductor surface layer 30') is crystal-grown between a deep layer 8 of the second nitride semiconductor (hereinafter referred to as 'second nitride semiconductor deep layer 8') and the third nitride semiconductor layer 18. That is, a second nitride semiconductor layer 32 is configured by the second nitride semiconductor deep layer 8 and the second nitride semiconductor surface layer 30.

In this embodiment, GaN is used as the first nitride semiconductor layer 6, i-type $Al_xGa_{1-x}N$ is used as the second nitride semiconductor deep layer 8, $Al_zGa_wIn_{1-z-w}N$ is used as the second nitride semiconductor surface layer 30, and p-type $Al_yGa_{1-y}N$ is used as the third nitride semiconductor layer 18. Bandgaps thereof satisfy a relationship: first nitride semiconductor 6<second nitride semiconductor deep layer 8<second nitride semiconductor surface layer 30. The bandgap of the third nitride semiconductor layer 18 may not especially be limited. In the present embodiment, the bandgap of the third nitride semiconductor layer 18 is almost equal to that of the second nitride semiconductor deep layer 8.

Figure 7:
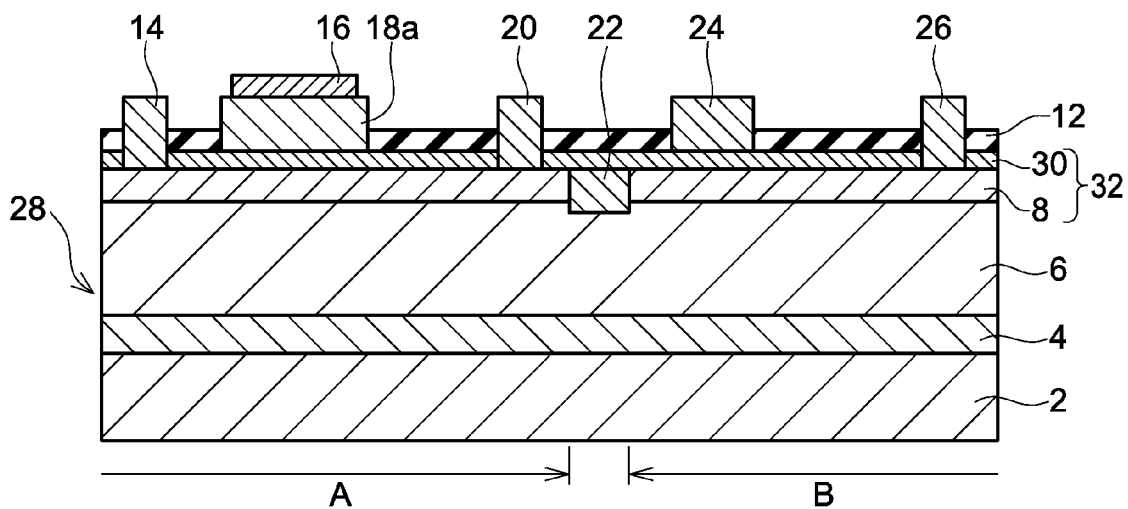
FIG. 7 is a sectional view of a semiconductor device according to a third embodiment.
Figure 8:
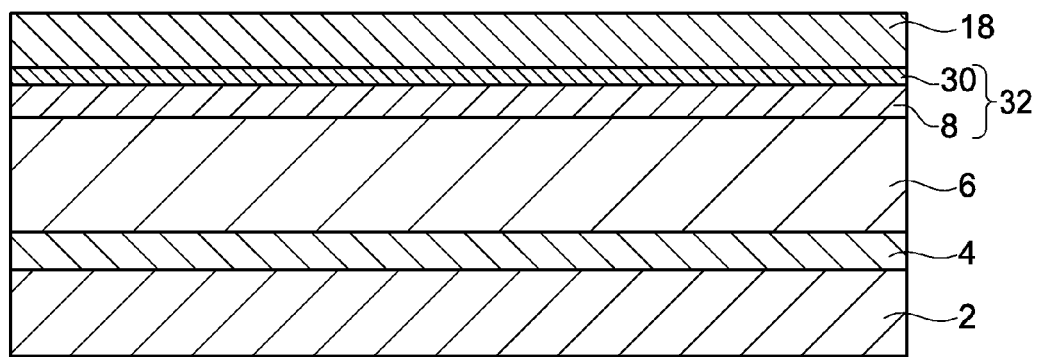
FIG. 8 shows a first stage of a method of manufacturing a semiconductor device according to the third embodiment.

In the present embodiment, as shown in FIG. 7, the second nitride semiconductor surface layer 30 is interposed between the p-type third nitride semiconductor layer 18a and the second nitride semiconductor deep layer 8. Even though the second nitride semiconductor surface layer 30 is interposed, an advantageous effect that the threshold voltage of the HEMT is raised to a positive value by the p-type third nitride semiconductor layer 18a is maintained, and the HEMT can be made normally-off.

Further, the second nitride semiconductor surface layer 30 is interposed between the anode electrode 24 and the second nitride semiconductor deep layer 8. In the present embodiment, the third nitride semiconductor layer 18 is etched to expose a front surface of the second nitride semiconductor surface layer 30, and the anode electrode 24 is formed on the font surface of the second nitride semiconductor surface layer 30.

As described above, when the third nitride semiconductor layer 18 is etched to expose the front surface of the second nitride semiconductor deep layer 8, the anode electrode 24 formed on the front surface of the second nitride semiconductor deep layer 8 does not form a Schottky junction with the front surface of the second nitride semiconductor deep layer 8. In contrast to this, when the third nitride semiconductor layer 18 is etched to expose the front surface of the second nitride semiconductor surface layer 30, the anode electrode 24 formed on the surface of the second nitride semiconductor surface layer 30 forms a Schottky junction with the surface of the second nitride semiconductor surface layer 30. Since the second nitride semiconductor deep layer 8 and the second nitride semiconductor surface layer 30 have different bandgaps to generate this difference on whether the Schottky junction is formed or not.

In the present embodiment, the source electrode 14, the drain electrode 20, and the cathode electrode 26 penetrate the second nitride semiconductor surface layer 30, and are directly in contact with the front surface of the second nitride semiconductor deep layer 8.

In order to obtain this structure, before the source electrode 14, the drain electrode 20, and the cathode electrode 26 are formed, the second nitride semiconductor surface layer 30 may be etched at positions where these electrodes are to be deposited whereby openings are formed, and then the source electrode 14, the drain electrode 20, and the cathode electrode 26 may be formed so as to penetrate the openings, respectively.

The openings may not be formed by etching the second nitride semiconductor surface layer 30. Instead of this, the source electrode 14, the drain electrode 20, and the cathode electrode 26 may be formed on the surface of the second nitride semiconductor surface layer 30 and then subjected to heat treatment. By performing the heat treatment, metals configuring the source electrode 14, the drain electrode 20, and the cathode electrode 26 are diffused into the second nitride semiconductor surface layer 30, whereby the source electrode 14, the drain electrode 20, and the cathode electrode 26 can be in ohmic contact with the second nitride semiconductor deep layer 8 as a result. When the heat treatment is performed, the anode electrode 24 is formed after the heat treatment. Since the anode electrode 24 is not thermally treated, the anode electrode 24 can form a Schottky junction with the second nitride semiconductor deep layer 8 through the second nitride semiconductor surface layer 30 as a result.

The structure in FIG. 2 may be incorporated in the structure in FIG. 7. More specifically, in a part of the forming region of the anode electrode 24, the third nitride semiconductor layers 18b and 18c may be caused to remain. In this case also, the second nitride semiconductor surface layer 30 similarly remains in the forming region of the anode electrode 24. When the third nitride semiconductor layers 18b and 18c remain in the part of the forming region of the anode electrode 24, a leakage current is suppressed. When the second nitride semiconductor surface layer 30 remains in the forming region of the anode electrode 24, a voltage drop occurring when current flows in a forward direction of the SBD decreases, whereby a voltage between the anode and the cathode when the forward current begins to flow decreases. An SBD having a small loss cannot be obtained. Notably, in this case, an electrode which is in ohmic contact with the surfaces of the third nitride semiconductor layers 18b and 18c is preferably formed to make potentials of the third nitride semiconductor layers 18b and 18c equal to potential of the anode electrode 24.

(Fourth Embodiment)

When the third nitride semiconductor layer 18 is etched to expose the surface of the second nitride semiconductor layer 8, etching damage occurs on the surface of the second nitride semiconductor layer 8. In most of the etching damages, nitrogen atoms drop out of the nitride semiconductor. For this reason, heat treatment is conducted in the presence of the ammonia gas, on the nitride semiconductor substrate in which the third nitride semiconductor layer 18 was removed and the surface of the second nitride semiconductor layer 8 has thereby been exposed. At this time, nitrogen is supplied to the nitride semiconductor to repair the etching damage. Thereafter, when the anode electrode 24 is formed, a Schottky junction is formed between the anode electrode 24 and the second nitride semiconductor layer 8. In this case, an etching condition under which an AlO film is formed may not be employed.

(Fifth Embodiment)

The third nitride semiconductor 18 may be wet-etched to expose the second nitride semiconductor layer 8. In this case, no etching damage is given to the front surface of the second nitride semiconductor layer 8. When the anode electrode 24 is formed on the front surface of the second nitride semiconductor layer 8 exposed after the wet etching, a Schottky junction is formed between the anode electrode 24 and the second nitride semiconductor layer 8.

In the embodiments, although GaN is used as the first nitride semiconductor other nitride semiconductors may be used. For example, AlGaN and the like may be used. When AlGaN is used as the first nitride semiconductor, AlInGaN or the like is used as the second nitride semiconductor. There are various combinations which satisfy the relationship: bandgap of first nitride semiconductor<bandgap of second nitride semiconductor.

Further, the third nitride semiconductor layer 18a may be crystal-grown in only the forming region of the gate electrode 16 shown in FIG. 1. Alternatively, the third nitride semiconductor layer may be formed in only regions of the third nitride semiconductor layers 18a, 18b, and 18c. It is possible to select where the third nitride semiconductor layer is crystal grown by performing the crystal growing after a targeted local region of the surface of the second nitride semiconductor layer 8 has been covered with a mask.

Specific examples of the present teachings have been described in detail, however, these are mere exemplary indications and thus do not limit the scope of the claims. The art described in the claims includes modifications and variations of the specific examples presented above. For example, the AlO film may include Ga.

Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor device comprising:
    a nitride semiconductor substrate in which both a High Electron Mobility Transistor (HEMT) and a Schottky Barrier Diode (SBD) are formed, wherein
    the nitride semiconductor substrate comprises:
        a HEMT gate structure region where a gate structure of the HEMT is formed; and
        an anode electrode region where an anode electrode of the SBD is formed, wherein
    a first laminated structure is formed at least in the HEMT gate structure region, and includes a first nitride semiconductor layer, a second nitride semiconductor layer crystal-grown on a front surface of the first nitride semiconductor layer, and a third nitride semiconductor layer crystal-grown on a front surface of the second nitride semiconductor layer,
    a second laminated structure is formed at least in a part of the anode electrode region, and includes the first nitride semiconductor layer and the second nitride semiconductor layer,
    the anode electrode contacts the front surface of the second nitride semiconductor layer,
    a bandgap of the second nitride semiconductor layer is larger than a bandgap of the first nitride semiconductor layer,
    the third nitride semiconductor layer is p-type, and
    at least in a contact region in which the front surface of the second nitride semiconductor layer contacts the anode electrode, the front surface of the second nitride semiconductor layer is finished to be a surface by which the second nitride semiconductor layer forms a Schottky junction with the anode electrode.

2. The semiconductor device according to claim 1, wherein
    the second nitride semiconductor layer comprises an oxide film including Al, the film being exposed on the front surface of the second nitride semiconductor layer at least in the contact region.

3. The semiconductor device according to claim 2, wherein the oxide film including Al is an AlO film.

4. The semiconductor device according to claim 3, wherein
    the third nitride semiconductor layer is laminated on the front surface of the second nitride semiconductor layer, in the part of the anode electrode region.

5. The semiconductor device according to claim 1, wherein
    the second nitride semiconductor layer includes a deep layer and a surface layer, and
    a bandgap of the surface layer is larger than a bandgap of the deep layer.

6. The semiconductor device according to claim 5, wherein
    the surface layer is configured of AlGaInN or an oxide of AlGaInN.

7. The semiconductor device according to claim 6, wherein
    the third nitride semiconductor layer is laminated on the front surface of the second nitride semiconductor layer, in the part of the anode electrode region.

8. The semiconductor device according to claim 1, wherein
    the third nitride semiconductor layer is laminated on the front surface of the second nitride semiconductor layer, in the part of the anode electrode region.

9. A method for manufacturing a semiconductor device that includes a High Electron Mobility Transistor (HEMT) and a Schottky Barrier Diode (SBD) formed on a common nitride semiconductor substrate, the method comprising:
    preparing a laminated substrate of nitride semiconductor that includes a first nitride semiconductor layer, a second nitride semiconductor layer crystal-grown on a front surface of the first nitride semiconductor layer, and a third nitride semiconductor layer crystal-grown on a front surface of the second nitride semiconductor layer, wherein a bandgap of the second nitride semiconductor layer is larger than a bandgap of the first nitride semiconductor layer, and the third nitride semiconductor layer is p-type;
    exposing the second nitride semiconductor layer by removing the third nitride semiconductor layer at least in a region in which an anode electrode of the SBD is to be formed;
    finishing an exposed front surface of the second nitride semiconductor layer exposed in the removing such that the exposed front surface of the second nitride semiconductor layer forms a Schottky junction with the anode electrode; and
    forming the anode electrode on the exposed front surface of the second nitride semiconductor layer after the finishing.

10. The method for manufacturing a semiconductor device according to claim 9, wherein
    the finishing includes one or more of (1) to (3) as below:
    (1) using a gas that oxidizes the exposed front surface of the second nitride semiconductor layer including Al;
    (2) configuring the second nitride semiconductor layer by a surface layer having a larger bandgap and a deep layer having a smaller bandgap, and exposing the surface layer by etching the third nitride semiconductor layer; and
    (3) conducting a heat treatment in a gas including nitrogen on the nitride semiconductor substrate having the second nitride semiconductor layer exposed by the removing.

11. The method for manufacturing a semiconductor device according to claim 9, wherein
    the exposing includes wet-etching the third nitride semiconductor layer to expose the front surface of the second nitride semiconductor layer which is to form the Schottky junction with the anode electrode, and
    the finishing is conducted in the exposing.

* * * * *